United States Patent [19]

Miller et al.

[11] Patent Number: 4,886,764
[45] Date of Patent: Dec. 12, 1989

[54] PROCESS FOR MAKING REFRACTORY METAL SILICIDE CAP FOR PROTECTING MULTI-LAYER POLYCIDE STRUCTURE

[75] Inventors: Robert O. Miller, The Colony; Fu-Tai Liou, Carrollton, both of Tex.

[73] Assignee: SGS-Thomson Microelectronics, Inc., Carrollton, Tex.

[21] Appl. No.: 357,666

[22] Filed: May 25, 1989

Related U.S. Application Data

[63] Continuation of Ser. No. 154,808, Feb. 11, 1988, abandoned.

[51] Int. Cl.$^4$ .......................................... H01L 21/283
[52] U.S. Cl. .................................... 437/200; 437/192; 437/246; 437/41; 437/983; 148/DIG. 15; 148/DIG. 19; 148/DIG. 147; 357/71
[58] Field of Search ............... 537/200, 192, 178, 179, 537/246, 41, 983, 193; 148/DIG. 19, DIG. 147, DIG. 15; 357/67, 71; 437/983, 193

[56] References Cited

U.S. PATENT DOCUMENTS

| | | | |
|---|---|---|---|
| 3,537,174 | 11/1970 | May | 437/192 |
| 4,227,944 | 10/1980 | Brown et al. | 148/DIG. 103 |
| 4,263,058 | 4/1981 | Brown et al. | 357/71 |
| 4,445,134 | 4/1983 | Miller | 357/71 |
| 4,707,723 | 11/1987 | Okamoto et al. | 357/67 |

FOREIGN PATENT DOCUMENTS

| | | | |
|---|---|---|---|
| 0063165 | 4/1983 | Japan | 357/71 |
| 0143570 | 8/1983 | Japan | 357/71 |
| 0263243 | 11/1986 | Japan | 437/41 |
| 2061615 | 5/1981 | United Kingdom | 437/200 |

OTHER PUBLICATIONS

Chow et al., *J. Appl. Phys.*, vol. 52, No. 10, Oct. 1981, pp. 6331-6336.
Murarka et al., *IEEE Journal of Solid State Circuits*, vol. SC-15, No. 4, Aug. 1980, pp. 474-482.
Campbell et al., *IBM Technical Disclosure Bulletin*, vol. 25, No. 4, Sep. 1982, pp. 1920-1921.
*IBM Technical Disclosure Bulletin*, vol. 28, No. 9, Feb. 1986, pp. 3968-3969.
*IBM Technical Disclosure Bulletin*, vol. 30, No. 7, Dec. 1987, pp. 259-260.

Primary Examiner—Brian E. Hearn
Assistant Examiner—T. N. Quach
Attorney, Agent, or Firm—Robert D. Lott; Richard K. Robinson

[57] ABSTRACT

A process for forming a capping layer over a titanium silicide layer includes forming a layer of polysilicon (16) over a gate-oxide layer (14). A layer of titanium (18) is then formed over the poly layer (16) followed by deposition of a composite layer of tantalum silicide (20). The structure is then patterned and subjected to an annealing process to form a titanium silicide layer (22) covered by the capping layer (20) of tantalum silicide. The tantalum silicide provides a much higher oxidation resistant layer with the underlying titanium silicide providing the desirable conductive properties needed for long runs of interconnects on a semiconductor structure.

15 Claims, 2 Drawing Sheets

PROCESS FOR MAKING REFRACTORY METAL SILICIDE CAP FOR PROTECTING MULTI-LAYER POLYCIDE STRUCTURE

This is a continuation of application Ser. No. 154,808, filed Feb. 11, 1988 now abandoned.

TECHNICAL FIELD OF THE INVENTION:

The present invention pertains in general to the formation of polycides and more particularly, to a capping layer for providing increased oxidation resistance and chemical stability of a polycide structure.

BACKGROUND OF THE INVENTION

As MOS integrated circuits have become more complex, circuit performance advances that normally result from the decrease in individual circuit component size with scaling has in recent years not been realized to its fullest extent. These advances have been limited by the RC time constant characteristics of the long interconnects required to interconnect the increased number of circuit components. To reduce the resistance component of these long interconnects, integrated circuit manufacturers have been turning to refractory metals, refractory metal silicides, and polysilicon/ refractory metal silicide composite films (referred to as polycides) to replace the polysilicon conventionally used for gate-level interconnects. Such materials offer interconnect sheet resistances of 1-3 Ohms per square, compared to 10 Ohms per square or more for polysilicon alone.

In addition to lower resistance, one advantage provided by polycides is the enabling of higher temperature processing subsequent to their deposition. This is necessary when attempting to form a high quality inter-level oxide to serve as an insulating layer between the various metal layers which, in present technology, can exceed three to four layers of interconnects. Typically, such oxide layers require the use of a deposited glass that is reflowed at temperatures of between 800°-900° C. Conventional metals such as aluminum, etc., will melt at this temperature. The use of a polycide provides a relatively stable material with a high melting point that will not go through phase changes during formation of the interlevel oxide.

During the design phase of a given process, there are a number of polycide films from which to select. Refractory metals such as titanium, tungsten, molybdenum, tantalum, etc. have been utilized to form the refractory metal silicide. Although all of these metals provide good thermal and chemical stability, they vary somewhat in their resistive properties. The most desirable refractory metal silicide from the standpoint of circuit operation is titanium silicide, which silicide exhibits the lowest electrical resistivity. In fact, titanium silicide is one of the few refractory metals that exhibits a lower electrical resistivity than the elemental metal from which the silicide is formed.

One disadvantage of titanium silicide is that it is not as resistant to oxidation as the other silicides. Therefore, any subsequent oxidation on the surface of the titanium silicide after formation thereof can result in a higher contact resistance for interconnections made from different levels to the silicide, which is a common problem that plagues most processing systems. Of course, use of silicides with much higher oxidation resistance and better chemical stability will solve this problem but these silicides do not exhibit the same resistance characteristics as titanium silicide. Therefore, there exists a need for improving the oxidation resistance of the silicide layer over that exhibited by titanium silicide without suffering any loss of conductive properties and chemical stability of the surface of the polycide.

SUMMARY OF THE INVENTION

The present invention disclosed and claimed herein comprises a method for forming a polycide structure that has an oxidation resistant cap formed thereon. The method includes first forming a layer of polycrystalline silicon over a semiconductor substrate. This is followed by formation of a primary layer of refractory metal over the polycrystalline silicon layer. A composite layer of refractory metal silicide is then formed over the primary refractory metal. The composite refractory metal layer has a sheet resistance that is at least equal to or greater than the sheet resistance of the resultant silicide of the primary refractory metal layer, and has a chemical stability and oxidation resistance that is greater than the silicide of the primary refractory metal layer. The refractory metal layer is then reacted with the underlying polysilicon to form the silicide thereof by consuming only a portion of the silicon in the polysilicon layer. The polycide structure is then defined by patterning and etching techniques.

In another embodiment of the present invention, the primary refractory metal layer is formed from titanium and the composite refractory material is tantalum silicide, such that a layer of tantalum silicide is disposed over the titanium silicide in the resultant structure. The tantalum silicide layer has a much higher chemical stability and an increased resistance to oxidation as compared to the titanium silicide. In a further embodiment of the present invention, a layer of gate-oxide is disposed under the polycrystalline silicon layer.

BRIEF DESCRIPTION OF THE DRAWINGS:

For a more complete understanding of the present invention and the advantages thereof, reference is now made to the following description taken in conjunction with the accompanying Drawings in which.

DETAILED DESCRIPTION OF THE INVENTION

Figure 1:
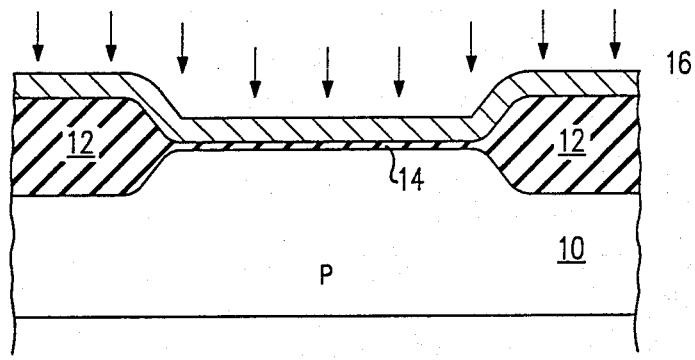
FIG. 1 illustrates a cross-sectional diagram of a semiconductor substrate having a polysilicon layer and associated gate-oxide layer formed thereon.

Referring now to FIG. 1, there is illustrated a cross-sectional diagram of one step in the fabrication process for a semiconductor structure. In conventional fabrication of MOS integrated circuits, a thin wafer of semiconductor material of one type conductivity, such as that identified by reference numeral 10 in FIG. 1, is first masked by a thick oxide layer. For illustrative purposes, the substrate 10 is P-type material. However, it should be understood that the opposite conductivity type material could be utilized. The oxide is then removed in a pattern to expose only those areas into which conductivity affecting impurities are to be diffused to form a "moat." The substrate 10 is then subjected to diffusion of the desired impurities at temperatures suitable for such diffusion and, after the desired penetration and concentrations have been achieved and oxide regrown over the moat, the wafer is removed from the diffusion environment. A surface insulating layer 12, referred to as a field oxide of silicon results from oxide growth and diffusion steps in the process, thus creating a layer of sufficient thickness so that later, when the thin layers of metalization are applied, any electric fields developed in normal operation of the devices are insufficient to adversely affect operations of those portions of the semiconductor element, other than those where the insulating layer is intentionally thin.

After forming the field oxide layer 12, the silicon surface in the moat is exposed to various conventional clean-up steps and then a thin layer of gate-oxide 14 is grown over the moat to a thickness of between 100–1,000 Angstroms. This is referred to as the gate-oxide layer for an MOS transistor. To provide a high-integrity gate-oxide, the moat may be exposed down to "virgin" silicon and then the gate-oxide layer 14 formed on the surface thereof.

After formation of the gate-oxide layer 14, a layer 16 of polycrystalline silicon (poly) is then deposited on the substrate by chemical vapor deposition (CVD) techniques to a thickness of approximately 2,000–4,000 Å. N-type impurities are then diffused or implanted into the poly layer 16 to decrease the sheet resistance thereof to approximately 10–20 Ohms per square. Typically, phosphorus is utilized as the N-type dopant. By use of a CVD process, the poly layer 16 is conformal in nature and conforms to the topology of the substrate 10.

Figure 2:
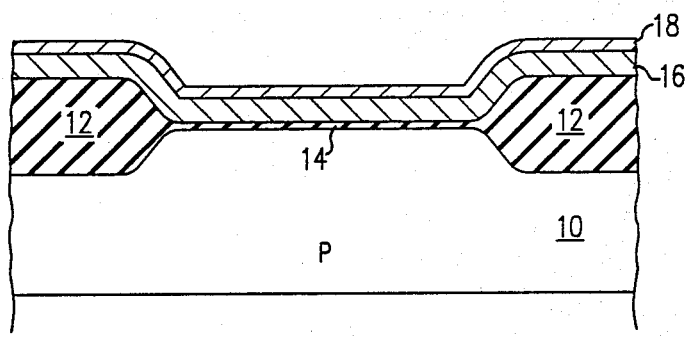
FIG. 2 illustrates a cross-sectional diagram of the structure of FIG. 1 with a layer of titanium disposed thereon.

Referring now to FIG. 2, after formation of the poly layer 16, the surface thereof is deglazed in dilute HF in a cleaning process, and then a layer of titanium 18 deposited on the substrate. Titanium is a refractory metal, which as will be described hereinbelow, is converted to titanium silicide. Titanium silicide is widely used in the industry to provide a lower sheet resistance to long runs of poly. The poly layer 16 is necessary in order to provide a high integrity gate-oxide thereunder. At present, techniques are not available to deposit the refractory metal 18 directly onto the gate-oxide layer. Therefore, the poly layer 16 is utilized as a "buffer" whereas the later formed titanium silicide, formed from the layer of titanium 18, provides the desired conductive properties.

The titanium layer 18 is deposited on the substrate by physical vapor deposition techniques. These techniques can either utilize a sputtering process or an evaporation process. In the preferred embodiment, the titanium is sputtered on with a Varian 3190 sputtering machine. This typically occurs at a temperature of 100° C. and in a vacuum to provide a thickness of titanium of approximately 800 Å.

Figure 3:
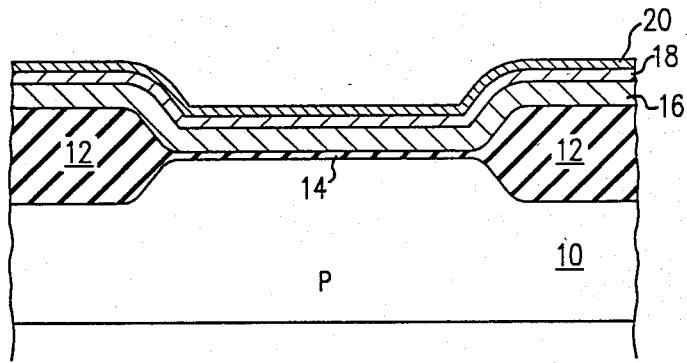
FIG. 3 illustrates a cross-sectional diagram of the semiconductor structure of FIG. 2 with a composite layer of tantalum silicide formed thereon.

Referring now to FIG. 3, there is illustrated a cross-sectional diagram of FIG. 2 with a composite layer 20 of tantalum silicide ($TaSi_2$) deposited on the substrate to a thickness of approximately 500 Å. In the preferred embodiment, this layer of tantalum silicide is sputtered on in situ with the titanium. The substrate 10 is maintained in the sputtering machine under vacuum for both deposition of the titanium layer 18 and the tantalum silicide layer 20. In this embodiment, the substrate is initially placed into the sputtering machine and then a conventional clean-up done on the upper surface of the polysilicon 16 by backsputtering. Two targets are placed in the sputtering machine, one comprised of titanium refractory metal and the other comprised of a composite material of tantalum silicide. Generally, the composite tantalum silicide material is silicon-rich. That is, the stoichiometry of the compound is therefore $TaSi_x$ wherein x varies between two and three; that is, the ratio of the two substances slightly exceeds 2:1. The titanium layer 18 is then deposited by sputtering at a temperature of approximately 100° C. after drawing a vacuum in the machine. The amount of titanium deposited is a function of the setting of the controls on the machine and the duration of the deposition process. Thereafter, the second target of tantalum silicide is selected and this is then deposited by a similar process utilizing a temperature of approximately 400° C.

It should be understood that it is not necessary to have the titanium and the tantalum silicide deposited in the same operation. For example, the titanium could be deposited by a different process such as evaporative deposition or in a separate sputtering machine and then the substrate placed in the sputtering machine for the tantalum silicide deposition. Of course, this could require a back-sputtering clean-up process prior to depositing the tantalum silicide.

Figure 4:
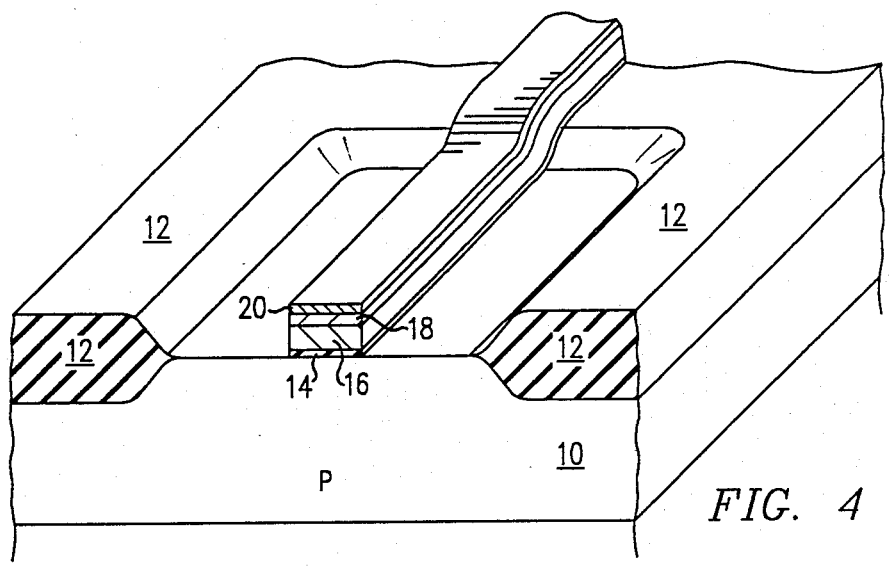
FIG. 4 illustrates a perspective view of the structure of FIG. 3 after patterning of the polycide layers.

After deposition of the composite layer 20 of tantalum silicide, the substrate is removed from the sputtering machine and then a layer of photoresist spun onto the substrate. This photoresist is patterned to define the conductive structure which, in the present example, is the gate of an MOS transistor. The substrate is then subjected to a plasma etch which is operable to etch the unpatterned areas away to define a multi-layer polycide structure which is comprised of the patterned layer 20 of tantalum silicide, the patterned layer 18 of titanium, the patterned layer 16 of polysilicon and the patterned layer 14 of gate-oxide. This is illustrated in FIG. 4, which depicts a perspective view of the gate of an MOS transistor. It can be seen that the gate of the transistor runs up over the field oxide layer 12 to provide interconnection with other circuitry.

Typically, the etching of the polycide is achieved with dry etching (plasma or reactive ion etching) techniques which have been long accepted methods of etching polysilicon to provide integrated circuit gates/or interconnect levels. The chemistry to provide anisotropic etching of polysilicon with good differential etch rates with respect to silicon dioxide is widely known. Additionally, methods for etching of polycides are also well known. This type of etching is primarily directed to defining vertical edges on the patterned structures. One technique for etching polycides is disclosed in U.S. Pat. No. 4,659,426, issued to Fuler, et. al., on Apr. 21, 1987 and entitled "Plasma Etching of Refractory Metals and Their Silicides." An additional technique is disclosed in U.S. Pat. No. 4,657,628, issued to Holloway on Apr. 14, 1987 and entitled "Process for Patterning Local Interconnects."

After patterning the polycide structure, the substrate is subjected to a rapid isothermal annealing process in an $N_2$ ambient. In the preferred embodiment, this is a two-step process. First, the substrate is subjected to a temperature of between 550°–650° C. for a duration of approximately one minute. The substrate 10 with the defined polycide structure is then subjected to a temperature of 800°–900° C., typically 900° C., for a duration of approximately twenty seconds. The purpose of this annealing process is to convert the titanium in layer 18 to titanium silicide by consuming a portion of the underlying poly layer 16. The formation of the titanium silicide is a conventional process.

Figure 5:
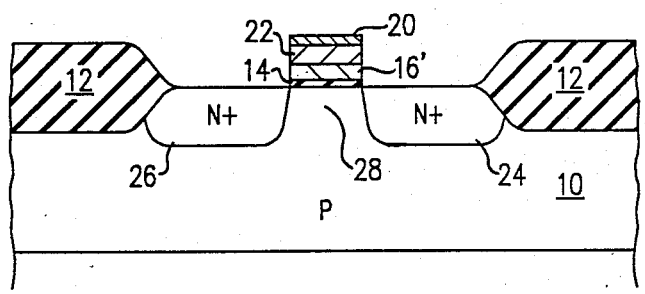
FIG. 5 illustrates a cross-sectional diagram of the structure of FIG. 4 wherein the titanium is converted to a silicide.

During the silicidation process, the titanium layer 18 consumes approximately 1,500–2,000 Å of the silicon in the underlying poly layer 16. As illustrated in FIG. 5, this results in formation of a titanium silicide layer 22 that is approximately 2,000 Å thick. This leaves a poly layer 16 that is approximately 1,500 Å thick.

The purpose of subjecting the substrate to the 550°–650° C. temperature for one minute is to insure that there is minimum grain boundary diffusion during the silicidation process. This allows the $N_2$ to go through the grain boundary and retard this grain boundary diffusion. The result is that the silicidation process at the temperature of 900° C. is relatively slow and smooth as compared to a normal silicidation process. Since the silicidation process is relatively quick, there could be spiking at the polycide/oxide interface with the gate-oxide layer 14. This is an undesirable result, and the processing at the 550–650° C. temperature retards this somewhat. Silicidation takes place at the 900° C. temperature.

Although the preferred embodiment is practiced by formation of the titanium silicide adjacent the polycrystalline silicon after the patterning and etching step, it should be understood that it is possible to subject the substrate to a temperature in excess of 850°–900° C. prior to the etching and patterning process to silicide before patterning. In addition, the titanium silicide can be formed prior to deposition of the tantalum silicide. It is only important that the tantalum silicide layer 20 be formed over the titanium silicide layer 22 in the resulting product.

The tantalum silicide layer 20, although a silicided refractory material, differs from titanium silicide in that it is much more resistant to oxidation, which is one of the important aspects of the present invention. However, straight deposition of the tantalum silicide layer 20 over the polysilicon layer 16 to form the primary conductive coating is not as desirable as having titanium silicide, since titanium silicide has lower resistance than tantalum silicide. Depending upon the refractory metal silicide utilized for the layer 20, which layer comprises a "capping" layer, the properties of that layer will vary. It is only important that the layer be more tolerant to oxidation than the titanium silicide layer 22. Therefore, the titanium silicide layer 22 is selected for providing the lowest sheet resistance with the layer 20 selected for providing the highest resistance to oxidation and optimum chemical stability for later processing.

If the structure of the present invention is not utilized, a compromise would have to be made between the chemical stability and the oxidation resistance and the electrical conductivity properties. With the process of the present invention, a refractory metal silicide can be utilized to provide a low-resistance layer without any substantial concern about its chemical stability and oxidation resistance. A second and capping layer can then be selected from the refractory metal silicides primarily for its chemical stability and oxidation resistance. This provides a technical advantage in that the processing steps can utilize the stability of the refractory metal silicides for such operations as forming interlevel oxides at temperatures in excess of 800° C., while providing a highly oxidation-resistant surface. This is important for forming contacts from a metalization layer to the tantalum silicide or capping layer 20. The formation of oxide on this layer would be undesirable since it would result in an increased contact resistance.

After formation of the polycide gate structure of FIG. 5, the processing is then completed to form the transistor. This is done by conventional techniques. The source/drains are formed by implanting N-type impurities, such as phosphorus and arsenic, into the substrate on either side of the patterned polycide gate structure. This results in a source 24 and a drain 26, being formed on either side of the gate structure. A channel region 28 is thereby formed underlying the gate-oxide layer 14 between the source and drain structures 24 and 26 respectively. This structure is illustrated in FIG. 5.

Figure 6:
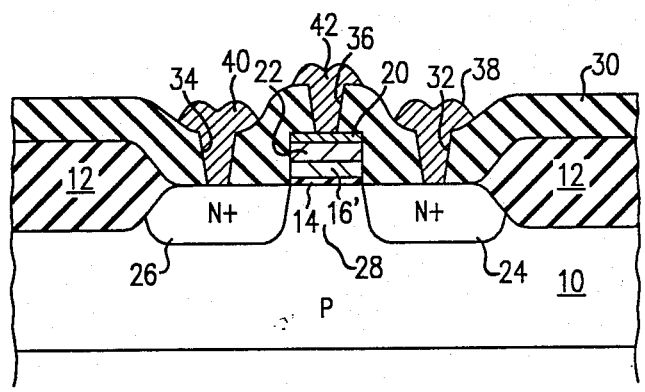
FIG. 6 illustrates a completed transistor.

Referring now to FIG. 6, after formation of the source 24 and drain 26, a layer of interlevel oxide 30 is deposited over the substrate to provide an insulating layer. An opening 32 is formed over the source 24, an opening 34 is formed over the drain 26 and an opening 36 is formed over the layer 20 in the gate structure. Although illustrated in a cross-sectional diagram of FIG. 6 as being in the same cross-sectional view as the openings 32 and 34, it should be understood that the opening 36 is typically offset from the openings 32 and 34 and over the field oxide layer 12.

After formation of the openings 32–36, a source contact or plug 38 is formed in the opening 32 and a drain plug 40 is formed in the opening 34 and a gate plug 42 is formed in the opening 36 to contact the underlying conductive structures. The plugs 38–42 can be formed from a CVD deposition of such materials as polysilicon or tungsten. Thereafter, a layer of metalization such as aluminum is deposited and patterned on the upper surface of the interlevel oxide layer 30. This comprises a level of metalization.

In summary, there has been provided a process for forming a polycide structure that includes a titanium silicide layer overlying a layer of polysilicon and a gate-oxide layer. A capping layer of tantalum silicide or refractory metal silicide that is more oxidation resistant and that has a higher chemical stability than the titanium silicide is then formed over the titanium silicide. The process includes first forming the layer of titanium over the polysilicon followed by the deposition of a layer of tantalum silicide. This multilayer polycide structure is then patterned and etched and then subjected to an annealing process to form titanium silicide from the titanium and underlying polysilicon material.

Although the preferred embodiment has been described in detail, it should be understood that various changes, substitutions and alterations can be made therein without departing from the spirit and scope of the invention as defined by the appended claims.

What is claimed is:

1. A method for forming a conductive structure on a semiconductor substrate with a titanium silicide film, comprising:

forming a layer of polycrystalline silicon on the surface of the substrate;

forming a conformal layer of titanium over the polycrystalline silicon layer to a predetermined thickness;

forming a composite layer of refractory metal silicide over the layer of titanium, the thickness of the refractory metal silicide layer substantially thinner than the predetermined thickness of the titanium, the refractory metal silicide layer being more chemically stable and having a higher oxidation resistance than titanium silicide;

reacting the titanium with the polycrystalline silicon to consume a portion of polycrystalline silicon layer to form a layer of titanium silicide such that a remaining portion of the polycrystalline silicon layer underlying the original layer of titanium is left, the titanium silicide layer forming the primary conductive path; and patterning and etching the substrate to define a polycide structure of polycrystalline silicon, titanium silicide and the refractory metal silicide.

2. The method of claim 1 wherein the step of forming the composite layer of refractory metal silicide and the step of forming the layer of titanium comprise first sputtering the layer of titanium on the surface of the polycrystalline silicon layer and then sputtering a composite layer of tantalum silicide onto the substrate on the upper surface of the titanium layer.

3. The method of claim 1 wherein the step of reacting the titanium in the titanium layer with the silicon in the polycrystalline silicon layer comprises annealing the structure at a temperature sufficient to provide the reaction of titanium with silicon to form titanium silicide.

4. The method of claim 1 wherein the step of forming the layer of polycrystalline silicon comprises depositing by CVD deposition a conformal layer of polycrystalline silicon to a predetermined thickness.

5. The method of claim 1 and further comprising forming a layer of oxide over the substrate prior to forming the layer of polycrystalline silicon.

6. A method for forming a polycide structure on a semiconductor substrate, comprising:

forming a layer of gate-oxide on the surface of the substrate;

depositing a layer of polycrystalline silicon on the surface of the gate-oxide layer to a predetermined thickness;

sputtering a layer of titanium over the surface of the polycrystalline silicon layer to a predetermined thickness;

sputtering a composite layer of tantalum silicide over the layer of titanium to provide an oxidation resistant layer having a thickness substantially less than the predetermined thickness of the titanium layer;

reacting the titanium in the titanium layer with the underlying silicon in the polycrystalline silicon layer to form a titanium silicide layer, wherein the titanium consumes only a portion of the polycrystalline silicon layer such that there is a remaining portion of the polycrystalline silicon layer underlying the resulting titanium silicide layer, the titanium silicide layer forming the primary conductive path;

patterning and etching the resultant structure to form a conductive structure; and forming a layer of insulating material over the conductive structure.

7. The method of claim 6 wherein the step of reacting the titanium with the silicon in the underlying polycrystalline silicon layer comprises applying a temperature to the titanium layer and the silicon layer that is sufficient to react titanium with silicon to form titanium silicide.

8. The method of claim 7 and further comprising restricting the temperature to a temperature that is slightly lower than the reaction temperature of titanium silicide prior to forming the titanium silicide layer in order to inhibit grain boundary diffusion.

9. The method of claim 6 wherein the conductive structure is the gate of an MOS transistor.

10. The method of claim 6 and further comprising forming a pattern of thick oxide over the substrate to form selected insulated areas defining exposed portions of the substrate, wherein the step of patterning and etching results in portions of the patterned polycide extending over the thick oxide areas.

11. A method for forming a polycide structure on a semiconductor substrate, comprising:

forming a layer of gate-oxide on the surface of the substrate;

depositing a layer of polycrystalline silicon on the surface of the gate-oxide layer to a predetermined thickness;

sputtering a layer of titanium over the surface of the polycrystalline silicon layer to a predetermined thickness;

sputtering a composite layer of tantalum silicide over the layer of titanium to provide an oxidation resistant layer and having a thickness substantially less than the predetermined thickness of the titanium layer;

patterning and etching the combined layers of tantalum silicide, titanium, polycrystalline silicon and gate-oxide to form a conductive structure; and reacting the titanium in the titanium layer with the underlying silicon in the polycrystalline silicon layer to form a titanium silicide layer, wherein the titanium consumes only a portion of the polycrystalline silicon layer such that there is a remaining portion of the polycrystalline silicon layer underlying the resulting titanium silicide layer, the titanium silicide layer forming the primary conductive path.

12. The method of claim 11 wherein the step of reacting the titanium with the silicon in the underlying polycrystalline silicon layer comprises applying a temperature to the titanium layer and the silicon layer that is sufficient to react titanium with silicon to form titanium silicide.

13. The method of claim 12 and further comprising restricting the temperature to a temperature that is slightly lower than the reaction temperature of titanium silicide prior to forming the titanium silicide layer in order to inhibit grain boundary diffusion.

14. The method of claim 11 wherein the conductive structure is the gate of an MOS transistor.

15. The method of claim 11 and further comprising forming a pattern of thick oxide over the substrate to form selected insulated areas defining exposed portions of the substrate, wherein the step of patterning and etching results in portions of the patterned polycide extending over the thick oxide areas.

* * * * *